(12) United States Patent
Wilson et al.

(10) Patent No.: US 9,741,403 B2
(45) Date of Patent: Aug. 22, 2017

(54) APPARATUSES AND METHODS TO PERFORM POST PACKAGE TRIM

(71) Applicant: MICRON TECHNOLOGY, INC., Boise, ID (US)

(72) Inventors: Alan J. Wilson, Boise, ID (US); Jeffrey P. Wright, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/539,331

(22) Filed: Nov. 12, 2014

(65) Prior Publication Data

US 2016/0133310 A1 May 12, 2016

(51) Int. Cl.
| | |
|---|---|
| G11C 5/00 | (2006.01) |
| G11C 7/20 | (2006.01) |
| G11C 11/4072 | (2006.01) |
| G11C 16/20 | (2006.01) |
| G11C 29/02 | (2006.01) |
| G11C 11/4093 | (2006.01) |
| G11C 11/4076 | (2006.01) |
| G11C 16/06 | (2006.01) |
| G11C 7/22 | (2006.01) |
| G11C 17/18 | (2006.01) |

(52) U.S. Cl.
CPC ............ *G11C 7/20* (2013.01); *G11C 11/4072* (2013.01); *G11C 16/20* (2013.01); *G11C 29/028* (2013.01); *G11C 7/22* (2013.01); *G11C 11/4076* (2013.01); *G11C 11/4093* (2013.01); *G11C 16/06* (2013.01); *G11C 17/18* (2013.01)

(58) Field of Classification Search
CPC ............ G11C 11/4085; G11C 11/4076; G11C 11/4093; G11C 16/06; G11C 17/18; G11C 7/22; G11C 17/20
USPC .................................................... 365/185.18
See application file for complete search history.

(56) References Cited

U.S. PATENT DOCUMENTS

| | | | |
|---|---|---|---|
| 3,886,323 | A | 5/1975 | Miller et al. |
| 5,278,839 | A | 1/1994 | Matsumoto et al. |
| 5,764,878 | A | 6/1998 | Kablanian et al. |
| 5,862,314 | A | 1/1999 | Jeddeloh |
| 5,910,921 | A | 6/1999 | Beffa et al. |
| 5,930,169 | A | 7/1999 | Iwata et al. |
| 5,974,564 | A | 10/1999 | Jeddeloh |
| 6,085,334 | A | 7/2000 | Giles et al. |
| 6,367,030 | B1 | 4/2002 | Yamauchi |
| 6,490,219 | B2 * | 12/2002 | Yoneya ................ G11C 7/1045 365/225.7 |

(Continued)

OTHER PUBLICATIONS

U.S. Appl. No. 14/077,630, filed Nov. 12, 2013, Wilson et al.

(Continued)

*Primary Examiner* — Han Yang
*Assistant Examiner* — Xiaochun L Chen
(74) *Attorney, Agent, or Firm* — Dorsey & Whitney LLP (57) ABSTRACT

Memory die can be stacked to form a three-dimensional integrated circuit. For example, through-silicon vias (TSVs) can permit signals to pass vertically through the three-dimensional integrated circuit. Disclosed herein are apparatuses and methods to perform post package trimming of memory die, which advantageously permits the memory die to be trimmed after the memory die is stacked, such that test and trimming characteristics are relatively close to that which will be actually be encountered.

17 Claims, 6 Drawing Sheets

(56) References Cited

U.S. PATENT DOCUMENTS

| | | | |
|---|---|---|---|
| 6,665,226 B2* | 12/2003 | Yoneya | G11C 7/1045 |
| | | | 365/225.7 |
| 6,967,878 B2 | 11/2005 | Dono | |
| 7,020,033 B2 | 3/2006 | Nagata et al. | |
| 7,350,119 B1 | 3/2008 | Zuraski, Jr. et al. | |
| 7,436,222 B2 | 10/2008 | Shyr et al. | |
| 7,437,626 B2 | 10/2008 | Chang et al. | |
| 7,536,267 B2 | 5/2009 | Zimmerman et al. | |
| 7,606,102 B2 | 10/2009 | Blodgett | |
| 7,684,266 B2 | 3/2010 | Lee | |
| 7,746,712 B2 | 6/2010 | Kang et al. | |
| 7,768,847 B2 | 8/2010 | Ong et al. | |
| 8,086,916 B2 | 12/2011 | Kopel | |
| 8,379,460 B2* | 2/2013 | Jeong | G11C 29/02 |
| | | | 365/189.05 |
| 8,593,891 B2* | 11/2013 | Nishioka | G11C 16/20 |
| | | | 365/191 |
| 8,645,583 B2 | 2/2014 | Vu et al. | |
| 9,343,184 B2 | 5/2016 | Wilson et al. | |
| 9,349,491 B1 | 5/2016 | Morgan et al. | |
| 2002/0051400 A1* | 5/2002 | Yoneya | G11C 7/1045 |
| | | | 365/225.7 |
| 2002/0133769 A1 | 9/2002 | Cowles et al. | |
| 2003/0031075 A1* | 2/2003 | Yoneya | G11C 7/1045 |
| | | | 365/225.7 |
| 2003/0038649 A1 | 2/2003 | D'Angelo | |
| 2005/0041491 A1 | 2/2005 | Kyung | |
| 2005/0097383 A1 | 5/2005 | Puri et al. | |
| 2005/0149782 A1 | 7/2005 | McPartland | |
| 2010/0046292 A1 | 2/2010 | Hahn et al. | |
| 2010/0124132 A1 | 5/2010 | Sarin et al. | |
| 2011/0110164 A1* | 5/2011 | Jeong | G11C 29/02 |
| | | | 365/189.02 |
| 2012/0027077 A1 | 2/2012 | Reznik | |
| 2012/0054549 A1 | 3/2012 | Kwan et al. | |
| 2012/0092943 A1* | 4/2012 | Nishioka | G11C 16/20 |
| | | | 365/191 |
| 2012/0267791 A1 | 10/2012 | Lee et al. | |
| 2013/0083612 A1 | 4/2013 | Son et al. | |
| 2013/0223171 A1 | 8/2013 | Kim et al. | |
| 2013/0235644 A1 | 9/2013 | Chung | |
| 2014/0049854 A1 | 2/2014 | Ho | |
| 2014/0078842 A1 | 3/2014 | Oh et al. | |
| 2014/0140138 A1 | 5/2014 | Tran et al. | |
| 2014/0211567 A1 | 7/2014 | Chung | |
| 2014/0223257 A1 | 8/2014 | Oh et al. | |
| 2015/0135038 A1 | 5/2015 | Wilson et al. | |
| 2015/0277790 A1 | 10/2015 | Mozak et al. | |
| 2016/0232987 A1 | 8/2016 | Wilson et al. | |

OTHER PUBLICATIONS

U.S. Appl. No. 14/246,589, filed Apr. 7, 2014, Wilson, et al.

Cataldo, Anthony, "Virage Logic Readies self-repairing embedded memory," EE Times, Mar. 6, 2001, 2 pages. Available at: http://www.eetimes.com/document.asp?doc_id=1143164&print=yes (accessed, Apr. 10, 2014).

Impact of I/O Settings on Signal Integrity in Stratix III Devices, Altera Corporation, Application Note 476, ver. 1.0, 15 pgs, Oct. 2007.

International Search Report and Written Opinion received for PCT/US2015059786 dated Apr. 21, 2016.

U.S. Appl. No. 15/382,394, entitled "Soft Post Package Repair of Memory Devices", filed Dec. 16, 2016.

TW Office Action received for TW Appl. No. 104137235 dated Nov. 22, 2016.

* cited by examiner

ABSTRACT

APPARATUSES AND METHODS TO PERFORM POST PACKAGE TRIM

BACKGROUND

Field of the Invention

The invention generally relates to electronics. In particular, the invention relates to memory devices.

Description of the Related Art

The performance of an integrated circuit is subject to many variables, including manufacturing process variability. To compensate for the manufacturing process variability, integrated circuits are often "trimmed" during manufacture. It would be desirable to improve the trim process to improve yield.

BRIEF DESCRIPTION OF THE DRAWINGS

These drawings and the associated description herein are provided to illustrate specific embodiments of the invention and are not intended to be limiting.

DETAILED DESCRIPTION

Although particular embodiments are described herein, other embodiments of the invention, including embodiments that do not provide all of the benefits and features set forth herein, will be apparent to those of ordinary skill in the art.

Figure 1:
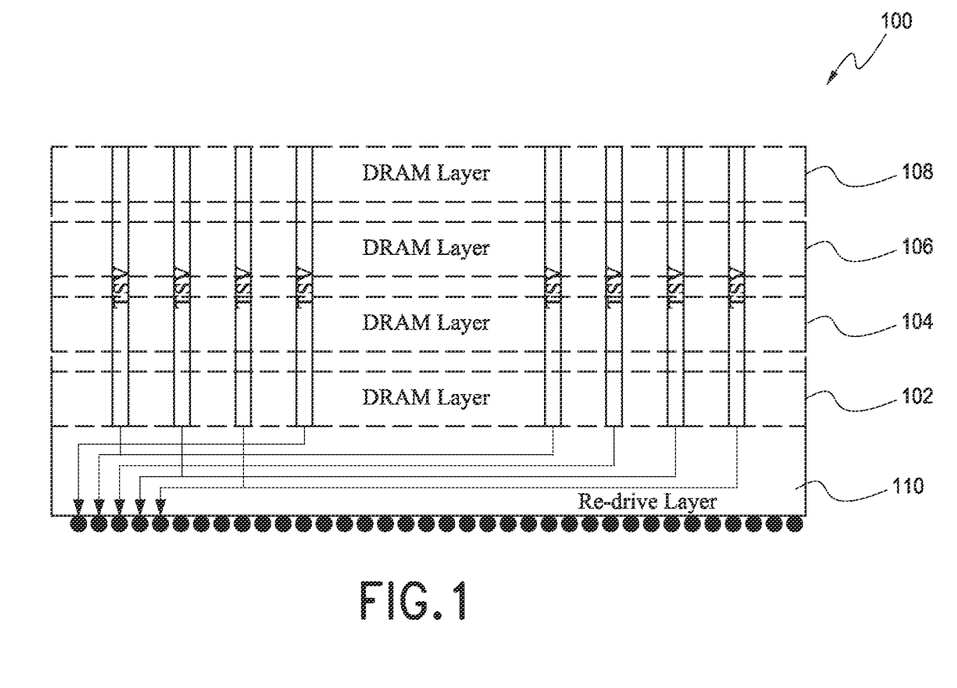
FIG. 1 illustrates a stack of die including through silicon vias (TSVs).

FIG. 1 illustrates a three-dimensional (3D) integrated circuit 100 including a stack of memory die 102, 104, 106, 108 and a re-drive layer 110. While illustrated with 4 memory die 102, 104, 106, 108, the number of memory die in the stack can vary in a very broad range of two or more. The memory die 102, 104, 106, 108 can include through-silicon vias (TSVs), which permit signals to pass through the various die of the stack in a vertical manner. A portion of the TSVs can be used to form a bus for addresses and/or data. This permits relatively dense packaging of memory for applications such as system on a chip (SOC) or system in a package (SIP) applications. The memory can be dynamic random access memory (DRAM), static random access memory (SRAM), flash memory, electrically erasable read only memory (EEPROM), phase change memory (PCM), or the like.

Conventionally, the memory die 102, 104, 106, 108 are tested individually and if trimmed, trimmed before packaging in a 3D integrated circuit. However, due to the stacking, conditions during manufacturing and test can be quite different from conditions encountered during use in the field. For example, there can be more parasitic capacitance on contacts connected to the TSVs due to parasitic capacitance from other die. In another example, the number of other memory die to be arranged in a stack can be an unknown. In another example, the position of a memory die within a stack can be unknown. This mismatch between test and operation can lead to failures during a system-level test or to failures in the field. Such failures can include, for example, a DRAM not operating reliably at its rated specifications. Disclosed herein are apparatuses and methods to perform post package trim of memory, which advantageously permits the memory die to be trimmed in a configuration closer to or the same as that used in the field. This can advantageously permit a system on a chip to operate the DRAM at its full speed, rather than at reduced speeds or with additional latencies.

Figure 2:
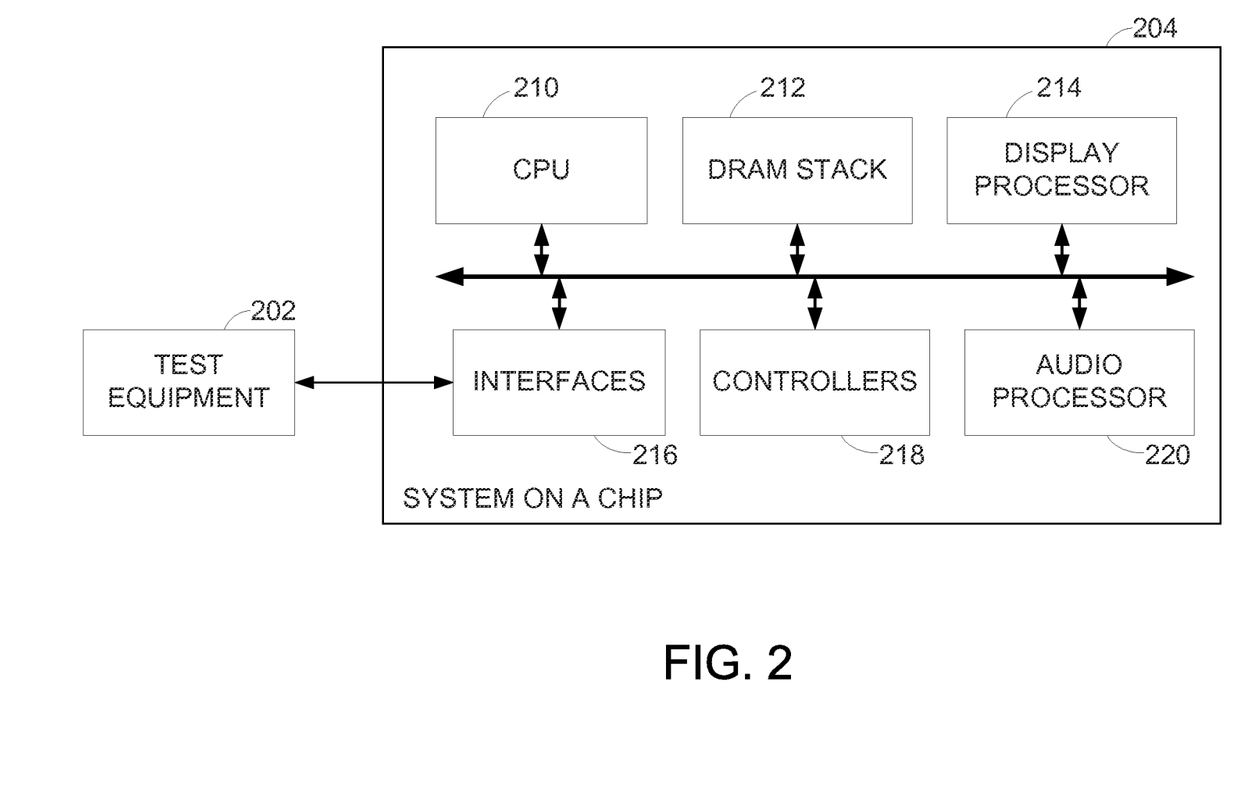
FIG. 2 illustrates an example of test equipment and a system on a chip.

FIG. 2 illustrates an example of test equipment 202 and a system on a chip 204. The illustrated system on a chip 204 includes a CPU 210, a DRAM stack 212, a display processor 214, interfaces 216, controllers 218, and an audio processor 220. System on a chip configurations can vary broadly and additional or fewer peripherals can be used. In addition, while illustrated in the context of a stack of DRAM for the DRAM stack 212, other types of memory such as flash memory can also be stacked. When the DRAM stack 212 is tested and trimmed after assembly into the system on a chip, the memory devices of the DRAM stack 212 can be tested in the actual environment in which they will operate.

The test equipment 202 can execute memory tests by, for example, providing test patterns to the DRAM stack 212 and monitoring for errors, by uploading executable code for a built in self-test, monitoring signals on busses, and the like. Memory testing techniques are well known to those of ordinary skill in the art.

Figure 3:
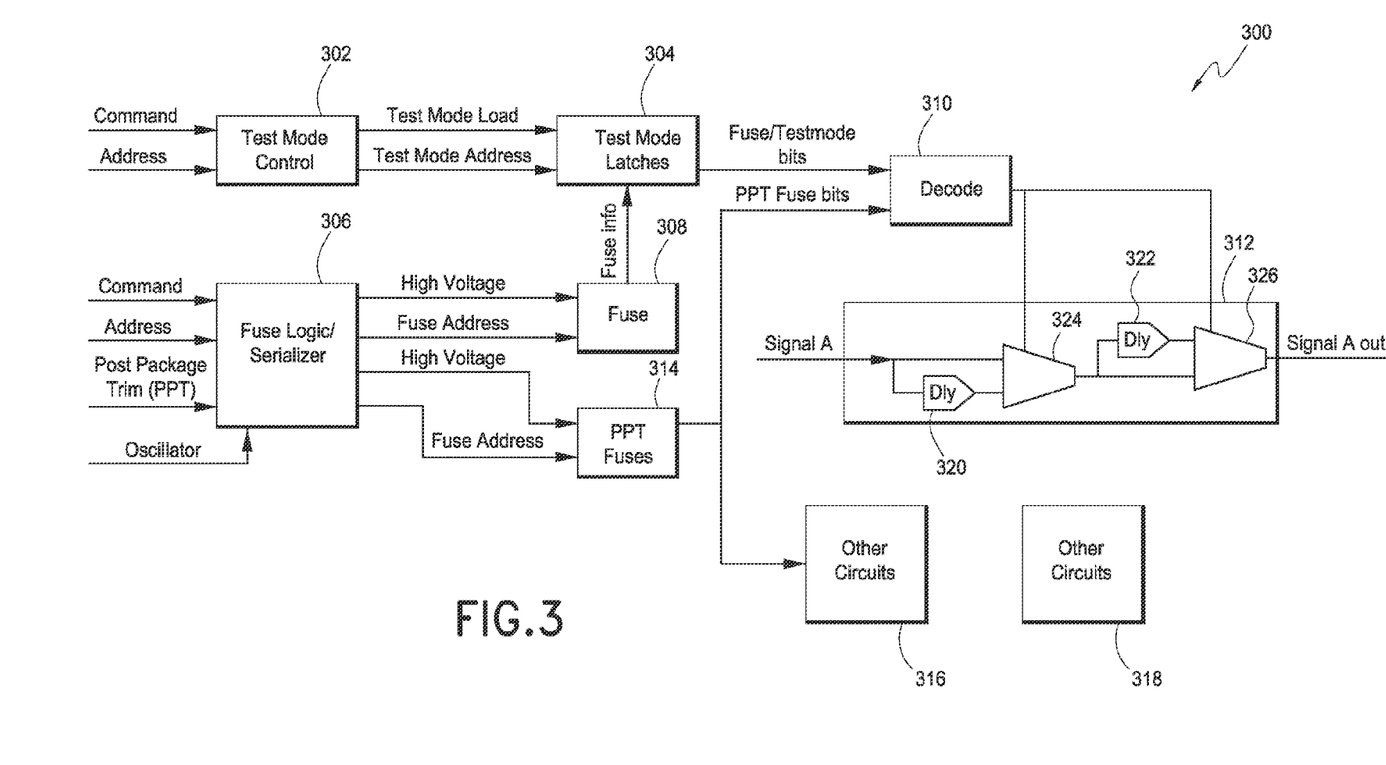
FIG. 3 is a block diagram of an embodiment of a portion of a memory device including post package trim.

FIG. 3 is a block diagram of an embodiment of a portion 300 of a memory device including post package trim (PPT). The illustrated portion 300 includes a test mode control circuit 302, test mode latches 304, a fuse logic/serializer 306, fuses 308, a decoder 310, a circuit to be trimmed 312, post package trim fuses 314, and other circuits to be trimmed 316. Of course, the memory device can include other circuits 318, such as one or more memory arrays, row and column decoders, sense circuits, address and data latches, buffers, interface circuits, and the like.

The portion 300 of the memory device has two different test modes for trim. A first test mode is used when the memory device is being tested by itself during manufacturing test. The first test mode can be optional when a facility for post package trim is present. A second test mode corresponds to a post package trim (PPT) test mode, which can be used after the memory device has been stacked with other memory devices and/or packaged in a system on a chip.

In the illustrated example, the circuit to be trimmed 312 corresponds to a delay. Such a delay can be used to determine the setup and hold time for a latch, such as an address latch or a data latch. There can be relatively many setup and hold times to be trimmed. Other items for the other circuits to be trimmed 316 can be trimmed, such as, but not limited to, voltages, the number of clock cycles in a latency, a frequency of a clock circuit, an output driver drive strength, and the like. The illustrated circuit to be trimmed 312 includes delay circuits 320, 322, and multiplexers 324, 326. The delay circuits 320, 322 can be implemented by, for example, gate delays. The multiplexers 324, 326 can select a path that includes zero, one, or two delays to adjust the delay through the circuit to be trimmed 312.

In one embodiment, the commands for the first test mode are provided to the memory device by probing on contacts. Since the first test mode can be performed before packaging, test equipment utilizing the first test mode can utilize contacts that are not available post packaging. Contacts that are also available post packaging can alternatively be used. The test mode control circuit 302 determines whether or not to enter the first test mode. The first test mode is implemented by the test mode control circuit 302, the test mode latches 304, the fuse logic/serializer 306, the fuses 308, and the decoder 310. In the first test mode, the test mode control circuit 302 can place data at appropriate addresses for the test mode latches 304 to test a trim setting. The outputs of the test mode latches 304 are provided as inputs to a decoder 310. The decoder 310 can interpret the setting from the test mode latches 304 to control the multiplexers 324, 326 of the circuit to be trimmed 312 or other trim settings for the other circuits to be trimmed 316.

After an appropriate setting is found, the setting can be stored by programming one or more fuses of the fuses 308. In one embodiment, the fuse logic/serializer 306 can program or "blow" fuses in a sequential manner as described in commonly-owned U.S. patent application Ser. No. 14/077,630, filed Nov. 12, 2013, titled "Post Package Repair of Memory Devices", the disclosure of which is incorporated by reference herein. The blowing of fuses in a sequential manner can advantageously reduce the peak current used to blow fuses. An oscillator signal can be used to step through the sequential blowing of the fuses. The memory device can then retrieve the stored settings from the fuses 308 for configuration during normal operation. If no trimming is indicated during the first test mode for a particular circuit, the corresponding fuses 308 do not need to be blown, and the decoder 310 can interpret the absence of blown fuses to use a default setting. During the first test mode and during normal operation without post package trimming, the decoder 310 uses the upper path from the test mode latches 304. As will be explained later, if the trim setting has been altered by PPT, the decoder 310 can select an alternate setting from the PPT fuses 314. It should be noted that as used herein, the term "fuses" as used in the fuses 308 and the PPT fuses 314 shall be construed to cover both fuses and antifuses. Fuses start as shorts and can be opened. Antifuses start as open circuits and can be shorted by, for example, causing dielectric breakdown in a relatively thin oxide layer between two nodes with a pulse of relatively high voltage. Other forms of non-volatile storage can alternatively be used to store trim settings.

The second test mode or PPT test mode is implemented by the fuse logic/serializer 306, the fuses 308, the test mode latches 304, and the decoder 310. In the illustrated embodiment, the input/output (I/O) that is already present on the memory device for addresses/data is used to communicate for the PPT test mode. In one embodiment, the memory device that is being trimmed includes redundant columns and/or rows for repair of one or more memory arrays and a facility for post package repair (PPR), and the protocols and interface circuits used for communicating with the memory device for PPT and PPR can be the same.

Based on commands received over the I/O, the fuse logic/serializer 306 can program new or alternative trim settings into the PPT fuses 314 that can override the original trim settings, if present, stored in the fuses 308 of the first test mode. The PPT fuse data is retrieved by the decoder 310 to determine whether or not a PPT setting should be used, and to retrieve the value of the PPT setting. If a PPT setting is present, the decoder 310 applies the PPT setting to the circuit to be trimmed 312. Otherwise, the decoder 310 can use a setting from the first test mode.

Figure 4:
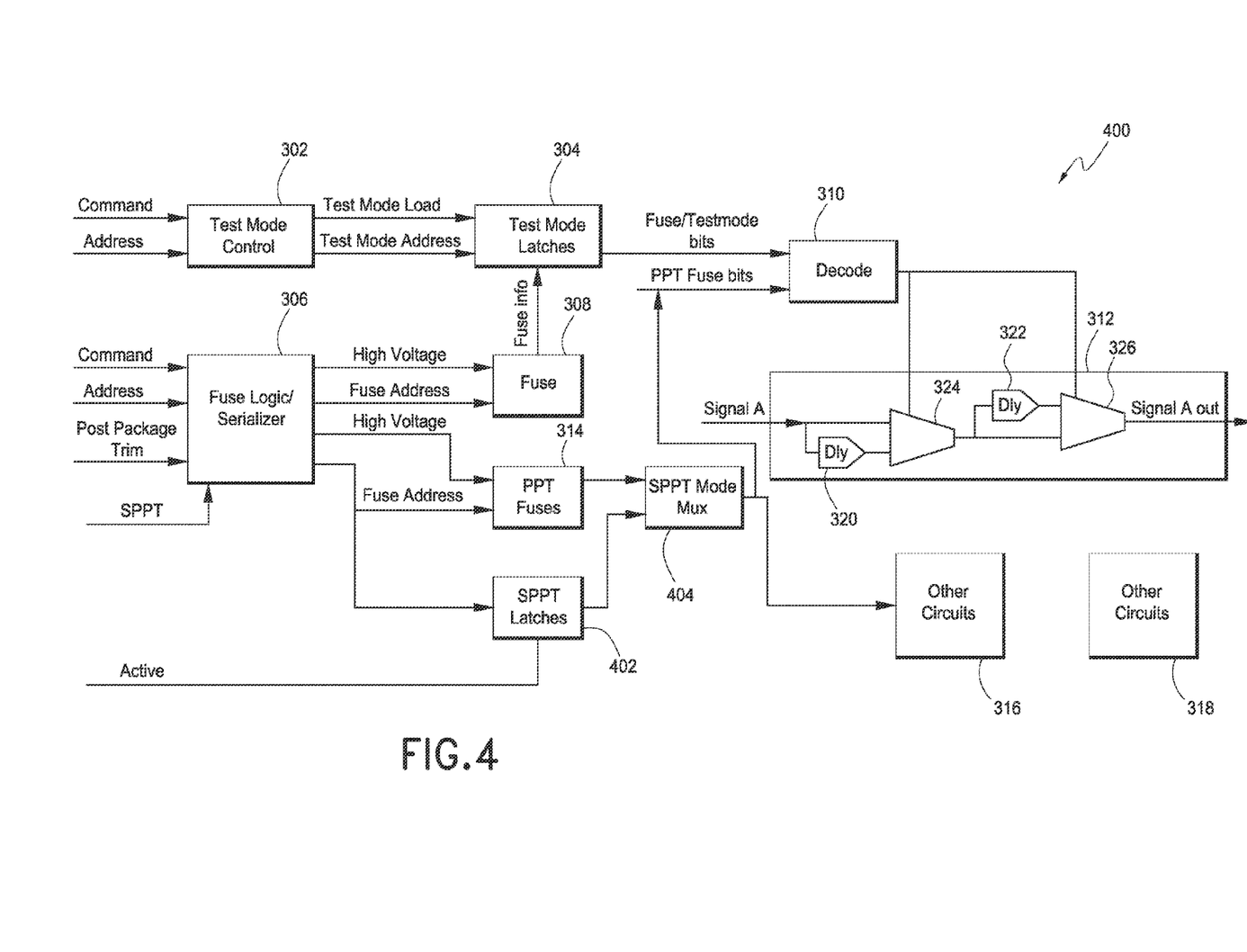
FIG. 4 is a block diagram of one embodiment of a portion of a memory device including post package trim and soft post package trim.

FIG. 4 is a block diagram of one embodiment of a portion 400 of a memory device including post package trim (PPT) and soft post package trim (SPPT). Once blown, fuses/antifuses cannot be unblown. The SPPT feature permits various trim settings to be tried before permanently committing to the settings by blowing fuses. For example, the various die of a stack can interact with each other and a trimming process may provide better performance if an iterative process is used. The SPPT feature permits system vendors to experiment with a variety of soft adjustments and assess performance over multiple devices of the stacked devices for input/output alignment, setup and hold times, and the like. After a relatively good configuration is found, these soft trim settings can be permanently stored by blowing fuses/antifuses.

The illustrated portion 400 includes a test mode control circuit 302, test mode latches 304, a fuse logic/serializer 306, fuses 308, a decoder 310, a circuit to be trimmed 312, post package trim (PPT) fuses 314, and other circuits to be trimmed 316. The portion 400 further includes SPPT latches 402 and an SPPT mode multiplexer (SPPT mode mux) 404 for provision of an SPPT mode. To avoid repetition of description, components in FIGS. 3 and 4 having the same or similar function may be referenced by the same reference number.

The SPPT latches 402 can correspond to data latches, registers, flip flops, SRAM cells, or the like. The SPPT latches 402 can be used to store temporary trim settings during the SPPT mode. During the SPPT mode, the fuse logic/serializer 306 can communicate with the test equipment via the memory device's I/O. Trim settings that work well can then be programmed to the PPT fuses 314. When trim settings do not work well, different trim settings can be tried. Advantageously, the SPPT latches 402 can be overwritten repeatedly so that various trim settings can be tried. An activate signal can control the latching of the SPPT latches 402.

The SPPT mode mux 404 has two sets of inputs. A first set of inputs is coupled to the PPT fuses 314, and a second set of inputs is coupled to the SPPT latches 402. When in the SPPT mode, the SPPT mode mux 404 selects the second set of inputs (SPPT fuses) as an output. Otherwise, the SPPT mode mux 404 can select the first set of inputs (PPT fuses) as an output. The output of the SPPT mode mux 404 is coupled to the decoder 310, which can trim the circuit to be trimmed 312 in the manner prescribed by the data in the SPPT latches 402 or the PPT fuses 314. It will be understood that there can be many sets of SPPT latches 402 and SPPT mode muxes 404 in a memory device to provide soft trimming of multiple parameters.

Figure 5:
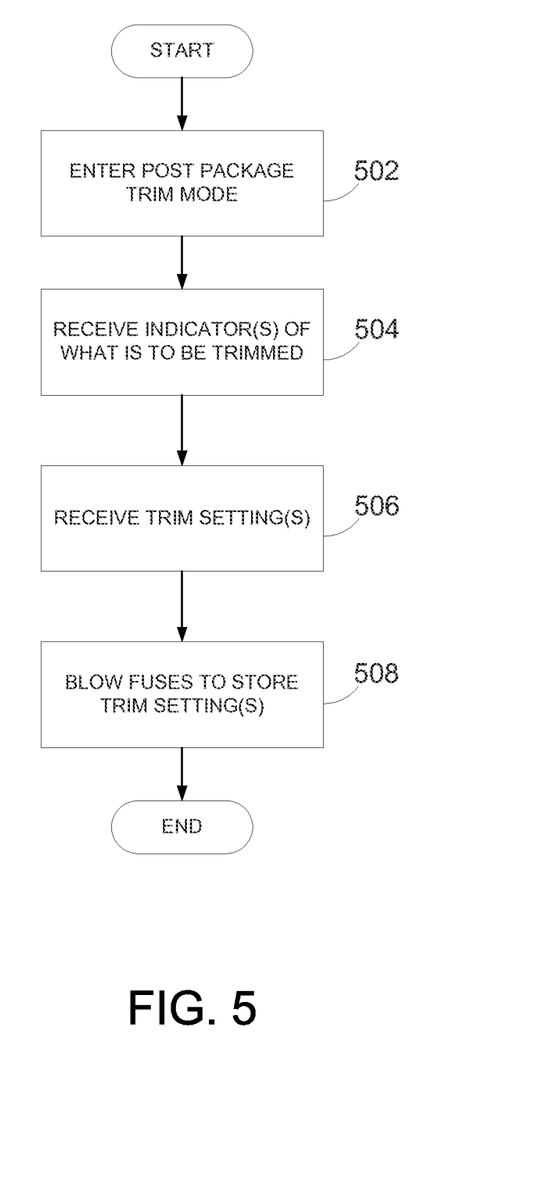
FIG. 5 is a flowchart, generally illustrating one embodiment of a process for post package trimming.

FIG. 5 is a flowchart, generally illustrating one embodiment of a process for post package trimming. The process can generally be performed by the fuse logic/serializer 306. It will be appreciated by the skilled practitioner that the illustrated process can be modified in a variety of ways. For example, in another embodiment, various portions of the illustrated process can be combined, can be rearranged in an alternate sequence, can be removed, or the like.

The process begins in a state 502 to enter the post package trim (PPT). For example, test equipment can communicate with the memory device's I/O directly or can communicate indirectly via, for example, a CPU of a system on a chip in which the memory device resides. The process advances from the state 502 to a state 504.

In the state 504, the process receives an indication of the parameter to be trimmed. For example, the indication can correspond to an address, and the address can be mapped to a parameter, such as a trim for a setup and hold of a particular latch. The process advances from the state 504 to a state 506.

In the state 506, the process receives the trim setting. For example, the setting can correspond to a delay in a setup and hold for a latch. The process advances from the state 506 to a state 508.

In the state 508, the process blows fuses to store the trim setting. For example, the fuse logic/serializer 306 can blow the applicable fuses of the PPT fuses 314. In one embodiment, the process sets up the trim settings for all the PPT fuses 314, and the applicable PPT fuses 314 are blown in a sequential manner. The process can be repeated as desired for other trim settings.

Figure 6:
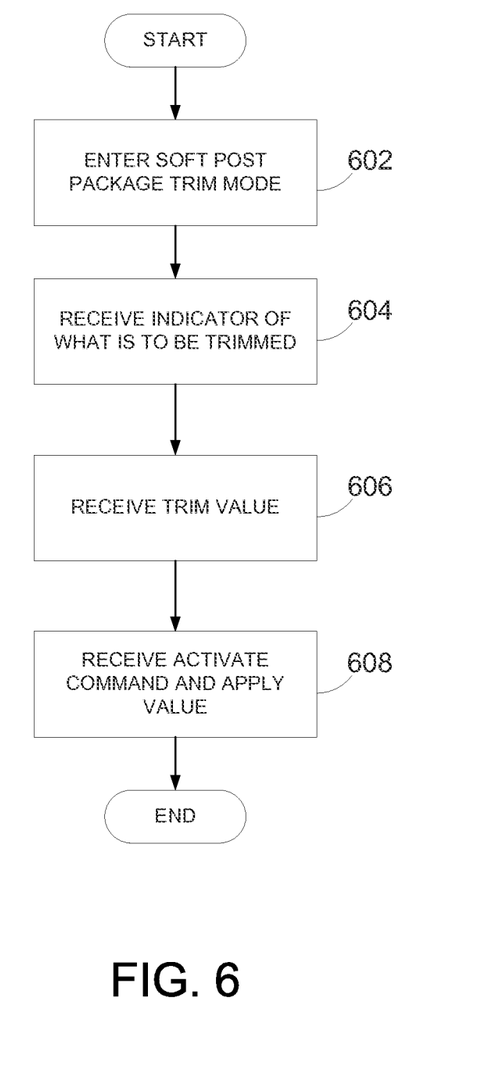
FIG. 6 is a flowchart, generally illustrating one embodiment of a process for soft post package trimming.

FIG. 6 is a flowchart, generally illustrating one embodiment of a process for soft post package trimming performed. The process can generally be performed by the fuse logic/serializer 306. It will be appreciated by the skilled practitioner that the illustrated process can be modified in a variety of ways. For example, in another embodiment, various portions of the illustrated process can be combined, can be rearranged in an alternate sequence, can be removed, or the like.

The process begins in a state 602 to enter the soft post package trim (SPPT) mode. In the SPPT mode, the SPPT mode mux 404 should be instructed to use the inputs that are coupled to the SPPT latches 402. For example, test equipment can communicate with the memory device's I/O directly or can communicate indirectly via, for example, a CPU of a system on a chip in which the memory device resides. The process advances from the state 602 to a state 604.

In the state 604, the process receives an indication of the parameter to be trimmed. For example, the indication can correspond to an address, and the address can be mapped to a parameter, such as a trim for a setup and hold of a particular latch. The process advances from the state 604 to a state 606.

In the state 606, the process receives the trim setting. For example, the setting can correspond to a delay in a setup and hold for a latch. The process advances from the state 606 to a state 608.

In the state 608, the process waits to receive an activate command, which can correspond to a rising edge on an activate signal, which is used to latch the setting to the SPPT latch. The signal can be generated by the fuse logic/serializer 306, another circuit, or externally. The process can be repeated until suitable trim parameters are found, and then the process can commit to the suitable trim settings by storing them in the PPT fuses 314 as described earlier in connection with FIG. 5.

One embodiment includes an apparatus, wherein the apparatus includes: an integrated circuit die comprising: an array of memory cells; an interface configured to permit data transfer to and from the integrated circuit die; a circuit configured to enter a post-package trim mode in response to instructions received over the interface, wherein the circuit is configured to receive one or more values and to adjust a characteristic of the integrated circuit relating to a memory characteristic based at least partly on the one or more values.

One embodiment includes an electronically-implemented method of performing trimming for an integrated circuit die, wherein the method includes: receiving, via an interface of the integrated circuit die, an instruction to enter a post-package trim mode, wherein the integrated circuit die comprises an array of memory cells, wherein the interface is configured to permit data transfer to and from the integrated circuit die; and receiving one or more values via the interface and adjusting a characteristic of the integrated circuit die relating to a memory characteristic based at least partly on the one or more values.

One embodiment includes a system on a chip, wherein the system on a chip includes: a processor; and a plurality of integrated circuit memory die, wherein the plurality of integrated circuit memory die are arranged in a stack and share a bus via through-silicon vias, wherein an integrated circuit memory die of the plurality of integrated circuit memory die comprises: an array of memory cells; a bus configured to permit data transfer to and from the integrated circuit die; a circuit configured to enter a post-package trim mode in response to instructions received over the bus and a chip select associated with the integrated circuit memory die, wherein the circuit is configured to receive one or more values and to adjust a characteristic of the integrated circuit relating to a memory characteristic based at least partly on the one or more values.

Unless expressly stated to the contrary, "coupled" means that one element/feature is directly or indirectly coupled to another element/feature, and not necessarily mechanically. Thus, although the drawings illustrate various examples of arrangements of elements and components, additional intervening elements, devices, features, or components may be present in an actual embodiment.

Semiconductor memory devices are ubiquitous in digital electronics devices and various systems. These various systems can include a process configured to execute instructions and/or access data stored on the memory devices. Examples of these devices include desktop computers, workstations, servers, tablets, laptop computers, digital cameras, video cameras, digital media players, personal digital assistants, smart phones, mobile phones, navigation devices, non-volatile storage products, kiosks, automotive products, and the like.

Devices employing the above described schemes can be implemented into various electronic devices. Examples of the electronic devices can include, but are not limited to, consumer electronic products, parts of the consumer electronic products, electronic test equipment, etc. Examples of the electronic devices can also include circuits of optical networks or other communication networks, including, for example base stations. The consumer electronic products can include, but are not limited to, an automobile, a camcorder, a camera, a digital camera, a portable memory chip, a washer, a dryer, a washer/dryer, a copier, a facsimile machine, a scanner, a multi-functional peripheral device, etc. Further, the electronic device can include unfinished products, including those for industrial, medical and automotive applications.

Various embodiments have been described above. Although described with reference to these specific embodiments, the descriptions are intended to be illustrative and are not intended to be limiting. Various modifications and applications may occur to those skilled in the art.

What is claimed is:
1. An apparatus comprising:
   an integrated circuit die comprising:
      an array of memory cells;
      an interface configured to permit data transfer to and from the integrated circuit die;
      a circuit configured to enter a post-package trim mode in response to instructions received over the interface, wherein the circuit is configured to:
         receive a first set of one or more values from the interface;
         store the first set of one or more values at a first latch;

adjust a characteristic of the integrated circuit relating to a memory characteristic based at least partly on the first set of one or more values from the first latch;

store the first set of one or more values in a first set of fuses in communication with the first latch;

receive a second set of one or more values from the interface;

store the second set of one or more values at a second latch;

adjust the characteristic of the integrated circuit relating to the memory characteristic based at least partly on the second set of one or more values from the second latch; and store the second set of one or more values in a second set of fuses, wherein the second set of fuses is not in communication with the first latch.

2. The apparatus of claim 1, wherein the integrated circuit die further comprises through-silicon vias, wherein the interface is coupled to the through-silicon vias such that a plurality of integrated circuit die are stackable to form a three-dimensional integrated circuit.

3. The apparatus of claim 1, wherein the circuit is configured to store the adjusted characteristic in a volatile manner for testing of a trimmed configuration.

4. The apparatus of claim 1, wherein the memory cells comprise dynamic random access memory (DRAM).

5. The apparatus of claim 1, wherein the memory cells comprise flash memory.

6. The apparatus of claim 1, wherein the adjusted characteristic comprises a setup and hold time of an address latch, a setup and hold time of a data latch, an output driver drive strength, or a configurable number of clock cycles for latency.

7. An electronically-implemented method of performing trimming for an integrated circuit die, the method comprising:

receiving, via an interface of the integrated circuit die, an instruction to enter a post-package trim mode, wherein the integrated circuit die comprises an array of memory cells, wherein the interface is configured to permit data transfer to and from the integrated circuit die;

receiving a first set of one or more values via the interface;

storing the first set of one or more values at a first latch;

adjusting a characteristic of the integrated circuit die relating to a memory characteristic based at least partly on the first set of one or more values from the first latch;

storing the first set of one or more values in a first set of fuses in communication with the first latch;

receiving a second set of one or more values via the interface; and storing the second set of one or more values at a second latch;

adjusting the characteristic of the integrated circuit relating to the memory characteristic based at least partly on the second set of one or more values from the second latch; and storing the second set of one or more values in a second set of fuses, wherein the second set of fuses is not in communication with the first latch.

8. The method of claim 7, wherein the integrated circuit die has through-silicon vias for the interface and is arranged in a stack of a plurality of integrated circuit die of a system on a chip the method further comprising having a processor of the system on a chip communicate with test equipment via an externally-accessible communications port, and having the processor send the one or more values via the interface for post-package trim mode.

9. The method of claim 7, further comprising storing the adjusted characteristic in a volatile manner in a second latch for testing of a trimmed configuration for soft post-package repair.

10. The method of claim 7, wherein the interface comprises an input/output for the integrated circuit die, further comprising receiving commands for the post-package repair mode over the input/output.

11. The method of claim 7, further comprising using a protocol for a post-package repair mode for the post-package trim mode.

12. The method of claim 7, wherein the adjusted characteristic comprises a setup and hold time of an address latch, a setup and hold time of a data latch, an output driver drive strength, or a configurable number of clock cycles for latency.

13. A system on a chip comprising:

a processor; and a plurality of integrated circuit memory die, wherein the plurality of integrated circuit memory die are arranged in a stack and share a bus via through-silicon vias, wherein an integrated circuit memory die of the plurality of integrated circuit memory die comprises:

an array of memory cells;

a bus configured to permit data transfer to and from the integrated circuit die;

a circuit configured to enter a post-package trim mode in response to instructions received over the bus and a chip select associated with the integrated circuit memory die, wherein the circuit is configured to:

receive a first set of one or more values from the bus;

store the first set of one or more values at a first latch;

adjust a characteristic of the integrated circuit relating to a memory characteristic based at least partly on the first set of one or more values from the first latch;

store the first set of one or more values in a first set of fuses in communication with the first latch, wherein the first set of fuses is configured to provide the first set of one or more values to the first latch;

receive a second set of one or more values from the bus;

store the second set of one or more values at a second latch;

adjust the characteristic of the integrated circuit relating to the memory characteristic based at least partly on the second set of one or more values from the second latch; and store the second set of one or more values in a second set of fuses, wherein the second set of fuses is not in communication with the first latch.

14. The system of claim 13, wherein the circuit is configured to store the adjusted characteristic in a volatile manner for testing of a trimmed configuration.

15. The system of claim 13, wherein the memory cells comprise dynamic random access memory (DRAM).

16. The system of claim 13, wherein the adjusted characteristic comprises a setup and hold time of an address latch, a setup and hold time of a data latch, an output driver drive strength, or a configurable number of clock cycles for latency.

17. The system of claim 13, wherein the processor is configured to communicate with test equipment with an external communications port separate from the bus, and wherein the processor is configured to control the bus for post-package trim mode.

* * * * *